United States Patent [19]

Miura

[11] 4,218,747

[45] Aug. 19, 1980

[54] ARITHMETIC AND LOGIC UNIT USING BASIC CELLS

[75] Inventor: Kenichi Miura, Saratoga, Calif.

[73] Assignee: Fujitsu Limited, Kawasaki, Japan

[21] Appl. No.: 912,451

[22] Filed: Jun. 5, 1978

[51] Int. Cl.² .......................... G06F 7/48; G06F 7/50
[52] U.S. Cl. .................................................. 364/716
[58] Field of Search ............................... 364/716, 786

[56] References Cited

U.S. PATENT DOCUMENTS

| | | | |
|---|---|---|---|
| 3,388,239 | 6/1968 | Duncan et al. | 364/716 |
| 3,711,693 | 1/1973 | Dahl | 364/716 X |
| 3,749,899 | 7/1973 | Kohoutek et al. | 364/716 |
| 4,033,797 | 7/1977 | Dill et al. | 357/42 X |
| 4,041,522 | 8/1977 | Ogvey et al. | 357/42 |
| 4,052,604 | 10/1977 | Maitland et al. | 364/786 |
| 4,084,152 | 4/1978 | Long et al. | 364/716 X |

OTHER PUBLICATIONS

Bodner et al., "Eight-Bit Arithmetic & Logic Unit", *IBM Tech. Disclosure Bulletin*, vol. 17, No. 8, Jan. '75, pp. 2402-2406.

*Primary Examiner*—David H. Malzahn
*Attorney, Agent, or Firm*—David E. Lovejoy

[57] ABSTRACT

An arithmetic and logic unit (ALU) formed by a small number of different types of basic cells suitable for cellular integration to form large scale integrated (LSI) semiconductor circuits. The arithmetic and logic unit is formed from a plurality of 1-bit ALU cells. Each ALU cell is formed by a plurality of cellular integrated basic cells where each ALU cell includes two data inputs, A and B, and responsively produces a data output, F. Each ALU cell has provision for some type of carry circuit, carry ripple or carry look-ahead. In a carry ripple example, the 1-bit ALU cells are of two basic types, an odd type and an even type. The carry-out from an odd type cell is connected as a carry-in to an even type cell and similarly, the carry-out of an even type cell is connected as a carry-in to an odd type cell. The arithmetic and logic unit is formed by a plurality of alternating odd and even 1-bit ALU cells.

16 Claims, 12 Drawing Figures

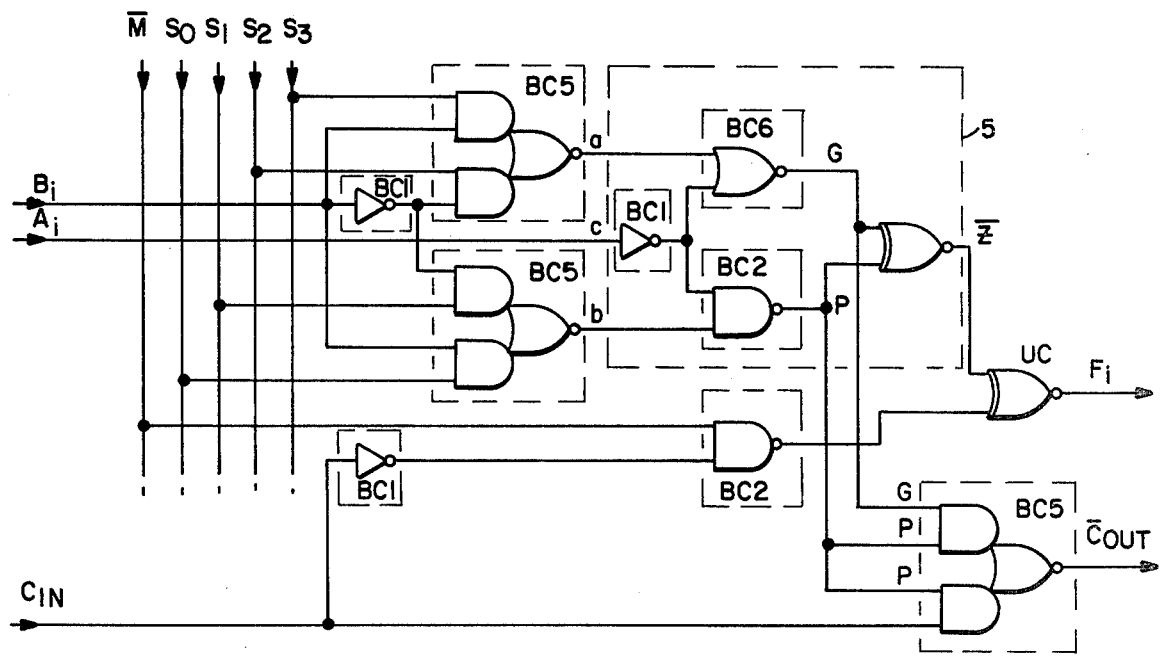
FIG.—1
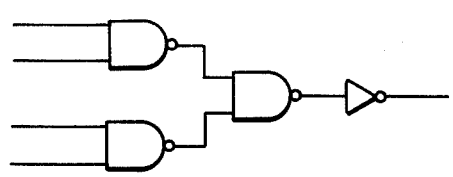
FIG.—2
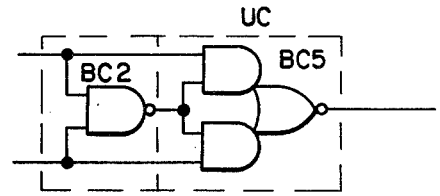
FIG.—3
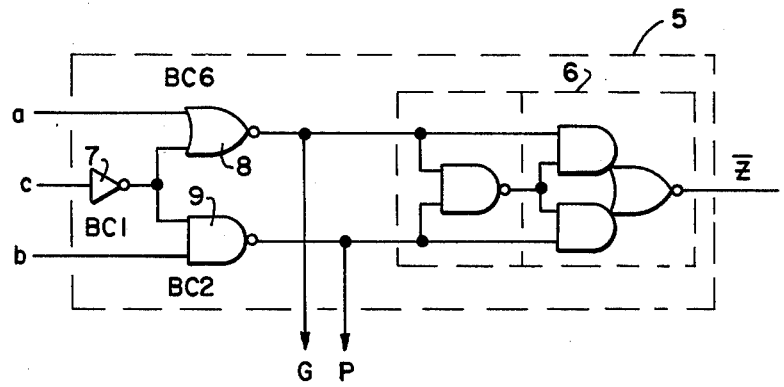
FIG.—4

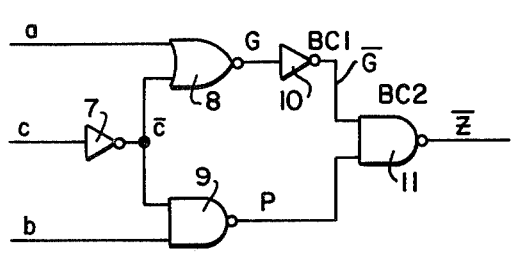
FIG — 5
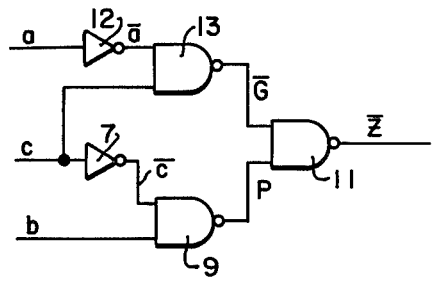
FIG. — 6
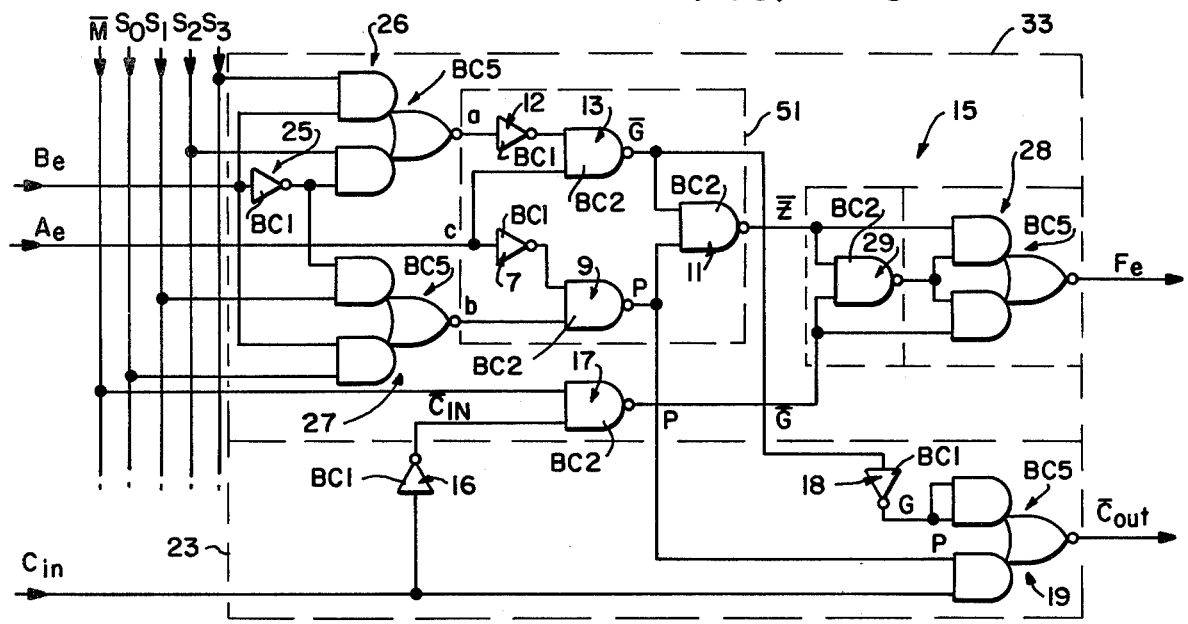
FIG. — 7
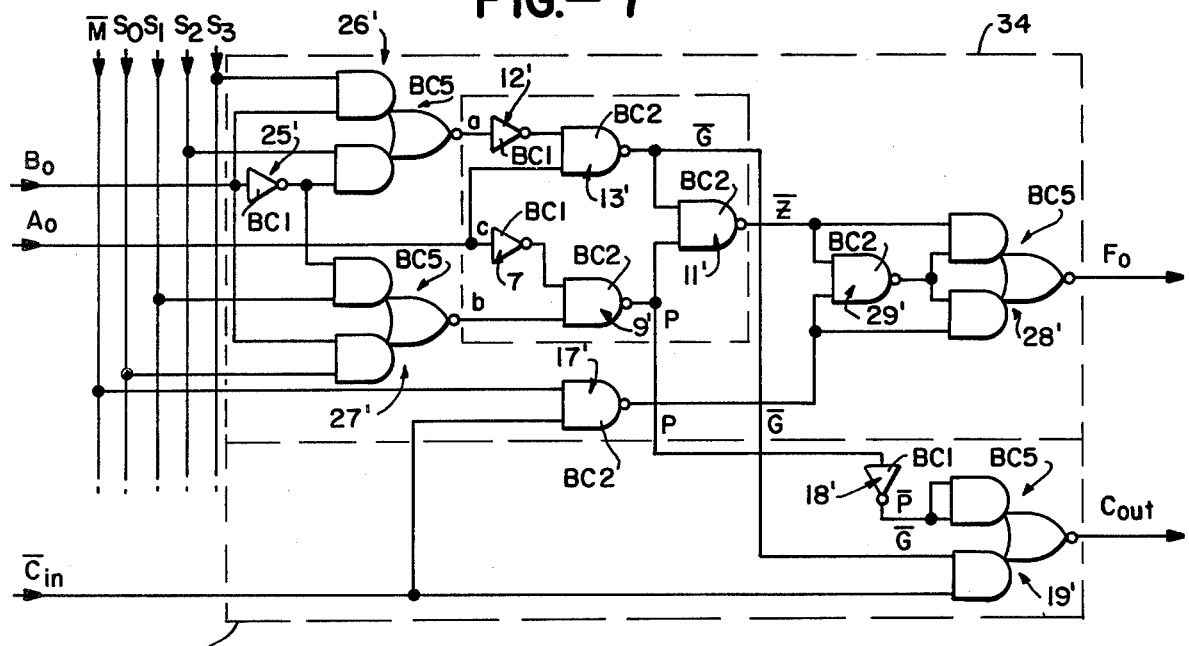
FIG. — 8

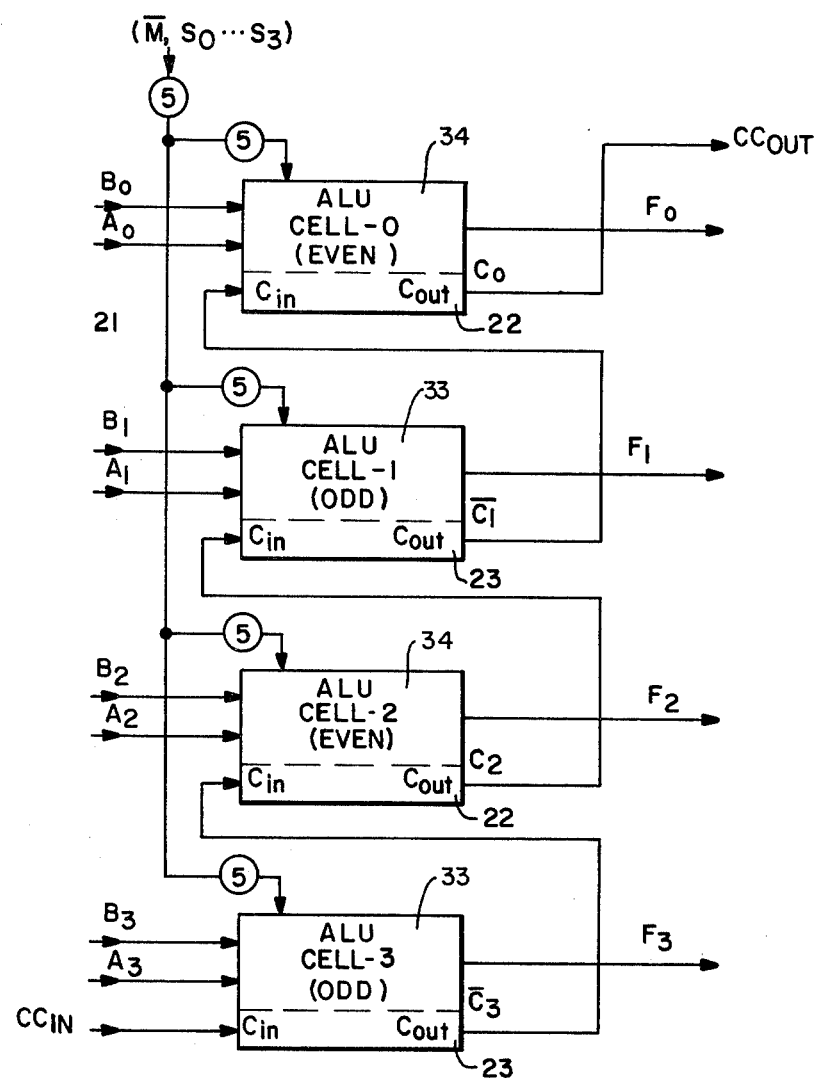
FIG.—9
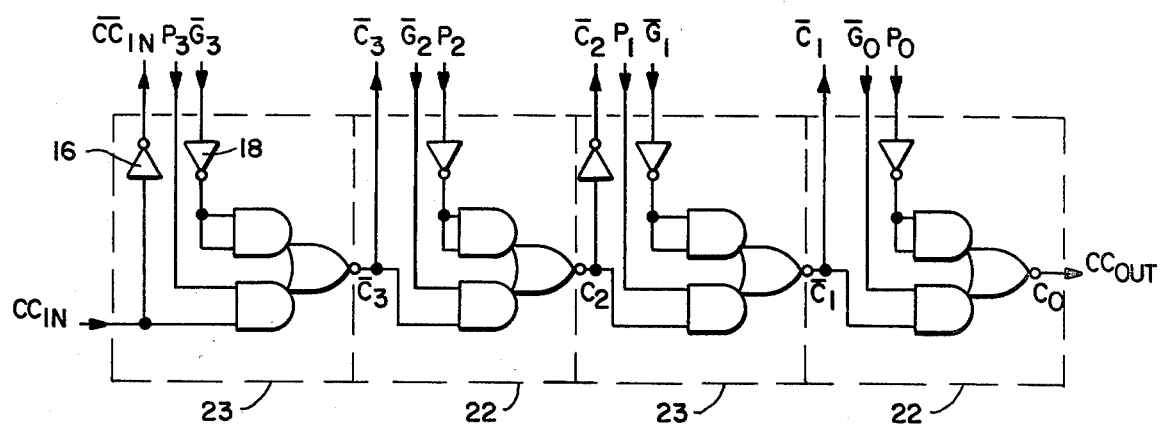
FIG.—10

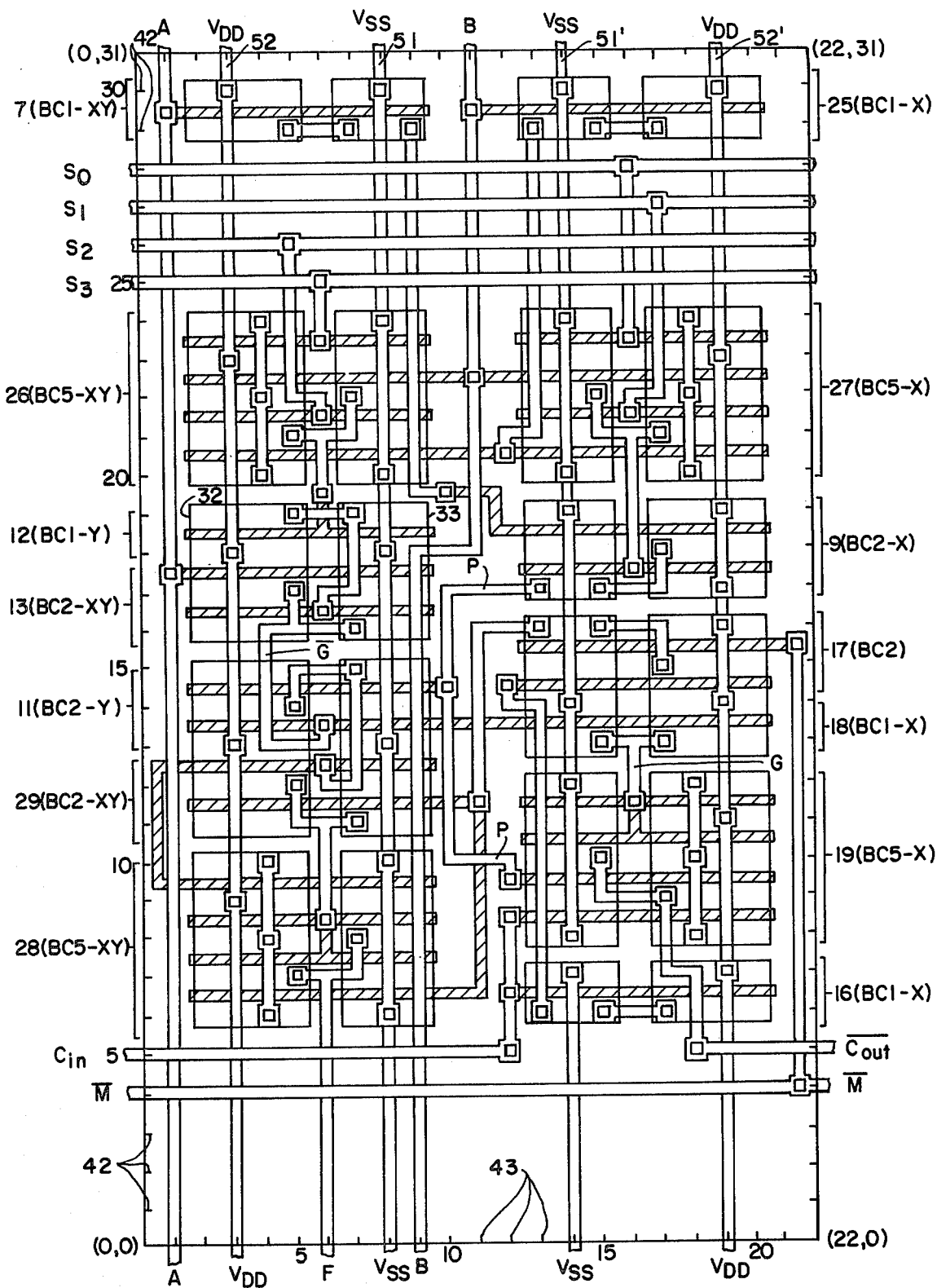
FIG.—11

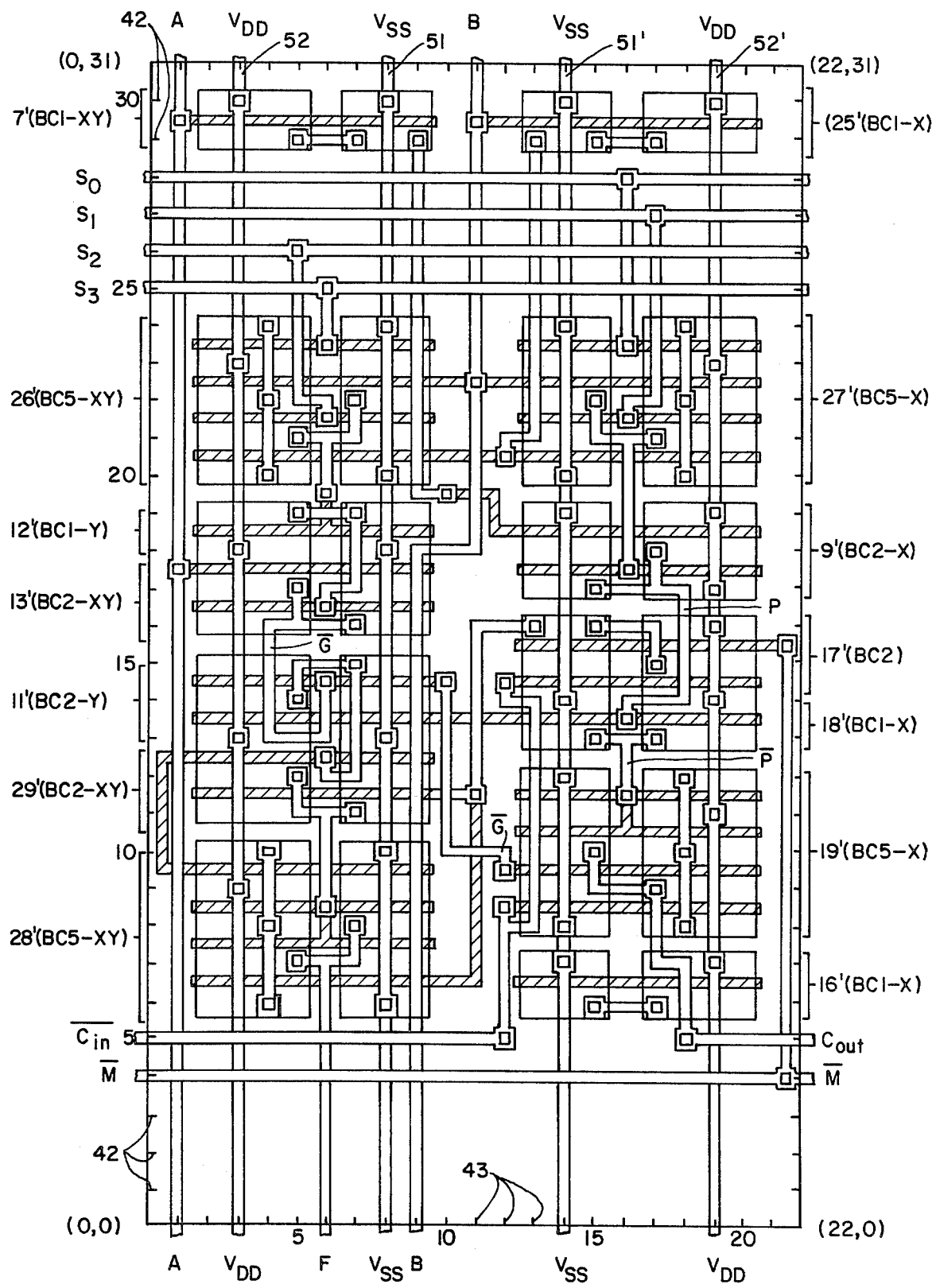
FIG.—12

ARITHMETIC AND LOGIC UNIT USING BASIC CELLS

CROSS REFERENCE TO RELATED APPLICATION

CELLULAR INTEGRATED CIRCUIT AND HIERARCHICAL METHOD, invented by Zasio, et al., Ser. No. 847,478, filed Nov. 1, 1977 and assigned to the same assignee as the present invention.

BACKGROUND OF THE INVENTION

The present invention relates to arithmetic and logic units and particularly to arithmetic and logic units implemented in accordance with hierarchical methods for large scale integration using semiconductor technology.

Cellular integrated circuits and hierarchical methods for forming large scale integrated circuits have been described in the above cross-referenced application entitled CELLULAR INTEGRATED CIRCUIT AND HIERARCHICAL METHOD. Briefly, the cellular integrated circuits are formed using one or more basic cells. For example, an INVERT basic cell (BC1), a 2-input NAND basic cell (BC2), a 2-input, 2-wide AND-OR-INVERT basic cell (BC5) and a 2-input NOR basic cell (BC6) among others are described in that application.

The basic cells and the resulting integrated circuits are formed with a grid pattern on a semiconductor body. The grid pattern is defined by parallel grid lines extending at angles (for example, 90 degrees) to each other along X and Y axes. One integrated circuit is formed by a plurality of interconnected basic cells. Each basic cell is formed by a plurality of active elements. Each of the basic cells is disposed within an area, generally no greater than a predetermined size, overlying a plurality of grid lines in both the X and Y axes. In this manner, each basic cell overlies a plurality of intersections of grid lines and those intersections define predetermined grid points. Each basic cell typically includes a power bus, a ground bus, one or more inputs and one or more outputs all having a predetermined arrangement with respect to certain grid points. The power bus, the ground bus, the inputs and the outputs connect internally to the basic cell at selected different grid points. Basic cells are interconnected with other basic cells to form larger integrated circuit units which are called unit cells. A number of unit cells are similarly interconnected to form still larger integrated circuits called functional blocks or functional generators. An arithmetic and logic unit (ALU) is an example of a functional block.

Arithmetic and logic units are well-known. For example, the Texas Instrument type SN74181 is one typical example of a 4-bit ALU. The 4-bit ALU has the four A inputs $A_0$, $A_1$, $A_2$, and $A_3$, the four B inputs $B_0$, $B_1$, $B_2$ and $B_3$ and has the respective four F outputs $F_0$, $F_1$, $F_2$ and $F_3$. The A and B inputs are combined either in an arithmetic operation mode or in a logic function mode to form the F outputs. The mode is controlled by a mode line, M. In the arithmetic operation mode, one of sixteen different arithmetic operations can be formed as a function of the state of the four S input control lines $S_0$, $S_1$, $S_2$, and $S_3$. Similarly, in the logic function mode, one of sixteen different logic operations can be performed as a function of the S input control lines.

The arithmetic and logic units previously known have been implemented with logical gate structures which are either not generally suitable for cellular integrated circuits and hierarchical methods or which are otherwise more complex than is necessary. Accordingly, there is a need for improved arithmetic and logic units which are particularly suited for forming cellular integrated semiconductor circuits.

In accordance with the above background, it is an object of the present invention to provide an improved arithmetic and logic unit particularly suited for implementation using cellular integrated circuits and hierarchical methods.

SUMMARY OF THE INVENTION

The present invention is an arithmetic and logic unit (ALU) formed by one or more 1-bit ALU cells. Each 1-bit cell is formed by a plurality of cellular integrated basic cells which are building blocks particularly suitable for forming large scale integrated semiconductor circuits.

Each 1-bit ALU cell includes a first plurality of cellular integrated basic cells connected to receive inputs, including a first data input (A) and a second data input (B) to logically combine the first and second data inputs to form internal data signals. Each 1-bit ALU cell also includes a second plurality of cellular integrated basic cells connected to logically combine the internal data signals to form a data output (F) as a function of the first and second data inputs.

In one embodiment, the AND-OR-INVERT basic cell, a NAND basic cell, and an INVERT basic cell are used. These basic cells are arranged to form an odd type 1-bit ALU cell and an even type 1-bit ALU cell. Each 1-bit ALU cell includes provision for a carry-in and a carry-out. The arithmetic and logic unit is formed by a plurality of alternating odd and even 1-bit ALU cells. The carry-out from the odd type cell is connected as a carry-in to an even type cell, and similarly, the carry-out from the even type cell is connected as a carry-in to an odd type cell.

In accordance with the above summary, the present invention achieves the objective of providing an improved arithmetic and logic unit particularly adaptable for implementation with cellular integrated circuits and hierarchical methods.

Additional objects and features of the present invention will appear from the following description in which the preferred embodiments of the invention have been set forth in detail in conjunction with the drawings.

BRIEF DESCRIPTION OF THE DRAWINGS

FIG. 1 depicts an electrical schematic representation of a 1-bit ALU cell for an arithmetic and logic unit (ALU).

FIG. 2 is an electrical schematic representation of the NAND gate and INVERT gate equivalent of the AND-OR-INVERT basic cell employed in FIG. 1.

FIG. 3 is an electrical schematic representation of an EXCLUSIVE-NOR unit cell formed by a combination of a AND-OR-INVERT basic cell and a NAND basic cell.

FIG. 4 is an electrical schematic representation of a section of the FIG. 1 ALU cell employing the EXCLUSIVE-NOR unit cell of FIG. 3 in combination with NOR, NAND and INVERT basic cells.

FIG. 5 depicts an electrical schematic representation of a circuit section logically equivalent to FIG. 4 with a simplification of the EXCLUSIVE-NOR cell in FIG. 4.

FIG. 6 depicts an electrical schematic representation of a circuit section logically equivalent to the FIG. 5 circuit section in which the NOR cell in FIG. 5 is replaced with an INVERT basic cell and NAND basic cell.

FIG. 7 depicts an electrical schematic representation of a 1-bit ALU cell of an odd type which employs the circuit section of FIG. 6.

FIG. 8 is an electrical schematic representation of a 1-bit ALU cell of an even type which employs the circuit section of FIG. 6.

FIG. 9 is a block diagram representation of a 4-bit arithmetic and logic unit employing the 1-bit ALU cells of FIGS. 7 and 8 connected in an alternating fashion.

FIG. 10 is an electrical schematic representation of the carry sections which form the carry circuitry of the arithmetic and logic unit of FIG. 9.

FIG. 11 is a cellular integrated circuit layout of the odd type 1-bit ALU cell of FIG. 7.

FIG. 12 is a cellular integrated circuit layout of the 1-bit even type ALU cell of FIG. 8.

DETAILED DESCRIPTION

In FIG. 1, a 1-bit arithmetic and logic unit (ALU) cell is shown. The cell of FIG. 1 is the logical equivalent of the Texas Instrument ALU SN 74181. Briefly, the cell of FIG. 1 includes the two data inputs $A_i$ and $B_i$ and the data output $F_i$. The cell functions in one of two modes, a logical mode and an arithmetic mode, as determined by the logical 1 or 0 state of the input mode control line $\overline{M}$.

Up to 16 different functions and operations are performable by the ALU of FIG. 1 under control of the four S inputs, $S_0$, $S_1$, $S_2$ and $S_3$. For arithmetic operations, a carry-in, $C_{IN}$, and a carry-out, $\overline{C}_{OUT}$ are provided.

The 1-bit ALU cell of FIG. 1 is formed using the basic cells of the type described in the above cross-referenced application. The INVERT basic cells are designated BC1. The AND-OR-INVERT basic cells are designated BC5. The NAND basic cells are designated BC2. The NOR basic cells are designated BC6. The EXCLUSIVE-NOR gates are designated as unit cells, UC, and may be formed by combinations of the basic cells.

In FIG. 1, the basic cells BC1, BC2, BC5 and BC6 are connected in an arrangement generally shown in FIG. 5b of the above-identified cross-referenced application. The EXCLUSIVE-NOR cells, UC, in FIG. 1 of the present application are analogous to the unit cells, UC7, in FIG. 5b of the cross-referenced application. For the purposes of a 1-bit ALU cell, the unit cells, UC of FIG. 1, may both be either EXCLUSIVE-NOR cells as shown, or may both be EXCLUSIVE-OR cells.

While the FIG. 1 ALU cell is one embodiment particularly suitable for cellular circuits employing hierarchical methods, the FIG. 1 circuit still utilizes four different types of cells, namely, BC1, BC2, BC5 and BC6 together with a unit cell, UC, which may include still additional types of basic cells. For cellular integration, it is desirable to reduce the number of different types of basic cells to as few as possible while still achieving a compact integrated circuit layout.

In order to reduce the number of basic cells and to simplify the FIG. 1 ALU cell, the NOR basic cells (BC6) are to be eliminated and the EXCLUSIVE-NOR gates are to be implementated using a NAND basic cell in combination with an AND-OR-INVERT basic cell (BC5). With these simplifications, the 1-bit ALU cell of FIG. 1 is implemented employing only the INVERT basic cell (BC1), the NAND basic cell (BC2) and the AND-OR-INVERT basic cell (BC5).

In FIG. 2, the logical NAND and INVERT gate equivalent of the AND-OR-INVERT basic cell is shown. The FIG. 2 circuit requires three gate delays while the AND-OR-INVERT basic cell requires less than two delays. Also, the physical area on a semiconductor chip for the AND-OR-INVERT basic cell is approximately one-half that of the FIG. 2 circuit. For these reasons, the AND-OR-INVERT basic cell is much preferred as a building block.

In FIG. 3, a representation of an EXCLUSIVE-NOR unit cell is shown as a combination of a BC2 NAND basic cell and a BC5 AND-OR-INVERT basic cell. The FIG. 3 EXCLUSIVE-NOR unit cell is to be employed as an embodiment of the EXCLUSIVE-NOR unit cells UC of FIG. 1.

In FIG. 4, the circuit section 5 of FIG. 1 is shown with the unit cell of FIG. 3 utilized for the EXCLUSIVE-NOR portion of the circuit section.

In FIG. 5, the EXCLUSIVE-NOR portion of the FIG. 4 circuit section has been simplified to a BC1 INVERT cell 10 and a BC2 NAND cell 11. In FIG. 5, the BC1 cell 7, the BC6 cell 8 and the BC5 cell 9 are unchanged from FIG. 4. The logical equivalence between the FIG. 4 and FIG. 5 circuit sections is established in the following way.

In FIG. 4, the three inputs are noted as a, b and c and the output is designated as $\overline{Z}$. The output from the NOR cell 8 is G and the output from the NAND cell 9 is P. The expressions for G and P in terms of a, b and c are given as follows:

$$G = \overline{(a + \overline{c})} = \text{NOR of } a \text{ and } \overline{c} \qquad \text{Eq.(1)}$$

$$P = \overline{b\overline{c}} = \text{NAND of } b \text{ and } \overline{c} \qquad \text{Eq.(2)}$$

In FIG. 4, the EXCLUSIVE-NOR cell combines the G and P values as follows:

$$\overline{Z} = G \oplus P = \text{EXCLUSIVE-NOR of } G \text{ and } P \qquad \text{Eq.(3)}$$

$$\overline{Z} = \overline{(a + \overline{c})} \oplus \overline{b\overline{c}} \qquad \text{Eq.(4)}$$

In accordance with Boolean algebra, Eq. (4) is modified as follows:

$$\begin{aligned} \overline{Z} &= ac(\overline{b} + c) + (a + \overline{c})b\overline{c} & \text{Eq.(5)} \\ &= (\overline{a})(\overline{b})c + \overline{a}c + ab\overline{c} + b\overline{c} & \text{Eq.(6)} \\ &= \overline{a}c + b\overline{c} & \text{Eq.(7)} \\ & & \text{Eq.(8)} \\ \overline{Z} &= \overline{(a + \overline{c})b\overline{c}} & \end{aligned}$$

Since $(a+\overline{c})$ equals $\overline{G}$ from Eq. (1) and since $\overline{b\overline{c}}$ equals P from Eq. (2), Eq. (8) is rewritten as follows:

$$\overline{Z} = \overline{\overline{G}P} \qquad \text{Eq.(9)}$$

In Eq. (9), it is evident that $\overline{Z}$ may be implemented as the NAND of $\overline{G}$ (inverted G) and P. In FIG. 5, the inverter 10 inverts G to $\overline{G}$ and the NAND basic cell 11 performs the NAND of $\overline{G}$ and P. The Eqs. (1) through (9) demonstrate that FIG. 5 is the logical equivalent of FIG. 4.

In FIG. 6, the $\overline{G}$ signal is generated by replacing the NOR basic cell 8 of FIG. 5 with the NAND basic cell 13 and the invert basic cell 12 in the manner shown. From FIG. 6, therefore, $\overline{G}$ and G are given as follows:

$$\overline{G} = \overline{\overline{a}c} = \text{NAND of } \overline{a} \text{ and } c \qquad \text{Eq.(10)}$$

$$G = \overline{\overline{a}c} = a + \overline{c} \qquad \text{Eq.(11)}$$

Since Eq. (1) and Eq. (11) are identical, FIG. 6 is logically equivalent to FIG. 5.

In FIG. 7, the circuit section 51 is identical to FIG. 6 and has been substituted for the circuit section 5 of FIG. 1. Also in FIG. 7, the EXCLUSIVE-NOR unit cell UC of FIG. 1 has been implemented as an EXCLUSIVE-NOR unit cell 15 formed from the basic cells BC2 and BC5 as shown in FIG. 3.

In FIG. 7, the 1-bit ALU cell 33 is of the odd type. The carry portion 23 of the ALU cell 33 of FIG. 7 receives the noninverted carry-in $C_{in}$ and produces the inverted carry-out $\overline{C}_{out}$. The carry portion 23 includes a BC1 INVERT basic cell 16 which forms the $\overline{C}_{in}$ value for connection to the BC2 NAND basic cell 17. Similarly, the $\overline{G}$ output from the BC2 NAND basic cell 13 is inverted in INVERT basic cell 18 to form G. The P output from the BC2 NAND basic cell 9 is not inverted. The P and G values are connected as inputs to the BC5 AND-OR-INVERT basic cell 19 which forms the inverted carry-out $\overline{C}_{out}$.

In FIG. 8, a 1-bit ALU cell 34 of the even type is shown. The cell 34 of FIG. 8 differs from the cell 33 of FIG. 7 in the carry circuit portion 22. In FIG. 8, the carry circuit portion 22 receives the inverted carry-in, $\overline{C}_{in}$, and produces the noninverted carry-out, $C_{out}$.

It should be noted that both the odd type ALU cell of FIG. 7, and the even type ALU cell of FIG. 8 each produce, under certain conditions of the control signals, the conventional bit propagate signal P and the conventional bit generate signal G where the bit generate signal is inverted to form the complementary signal. Whenever the control signal $S_0$ through $S_3$ are appropriately selected as 1's, then the bit generate signal is equal to the logical AND of A and B, that is, $A_eB_e$ in the case of FIG. 7 and $A_0B_0$ in the case of FIG. 8. Similarly, the bit propagate signal is equal to the logical OR of A and B, that is, $A_e+B_e$ in the case of FIG. 7 and $A_0+B_0$ in the case of FIG. 8.

Both FIGS. 7 and 8 form the bit propagate and bit generate signals such that one is the opposite polarity of the other. Of course, either one of the P or the G signals can be the complemented one.

In FIG. 9, a plurality of the 1-bit ALU cells 33 and 34 are alternated to form a 4-bit unit. The 4-bit unit includes the ALU cell-3 and the ALU cell-1 which are like the odd type cell 33 of FIG. 7. The 4-bit unit of FIG. 9 includes the ALU cell-2 and the ALU cell-0 which are like the cell 34 of FIG. 8. All of the cells 33 and 34 receive the five control lines $\overline{M}$, $S_0$, $S_1$, $S_2$ and $S_3$ generally indicated by the lines 21. The negative carry-out, $\overline{C}_3$, from the ALU cell-3 connects to the carry-in of the ALU cell-2. The positive carry-out, $C_2$, connects as the carry-in to the ALU cell-1. The negative carry-out, $\overline{C}_1$, connects as the carry-in to the ALU cell-0. The positive carry-out, $C_0$, forms the final carry-out, $CC_{out}$, for the overall 4-bit ALU.

In FIG. 10, the carry ripple type portions 23 and 22 of the 4-bit ALU of FIG. 9 are shown connected in series. It should be noted that the odd type circuits 23 invert the $\overline{G}$ signals so that both P and G are the inputs to the AND-OR-INVERT basic cells. In the even type carry circuits 22, the P inputs are inverted to $\overline{P}$ so that the AND-OR-INVERT basic cells receive $\overline{P}$ and $\overline{G}$ inputs. In this manner, the carry circuits which receive positive carry-in's, for example, $CC_{IN}$ and $C_2$ provide negative carry-out's, for example, $\overline{C}_3$ and $\overline{C}_1$, respectively. Those carry circuits which receive negative carry-in's, for example, $\overline{C}_3$ and $\overline{C}_1$, produce positive carry-out's, for example, $C_2$ and $C_0$, respectively.

In FIG. 10, the carry ripple circuits 22 and 23 are one example of carry circuits which can be employed with the ALU cells of FIGS. 7 and 8. Since the carry circuits are independent of the other parts of the ALU cells, the carry circuits may be implemented in any other convenient and equivalent form, carry ripple or carry look-ahead.

In FIG. 11 and FIG. 12, a cellular integrated circuit layout for the 1-bit ALU units of FIG. 7 and FIG. 8 respectively, are shown for complementary metal oxide semiconductor (CMOS) devices.

The general construction and fabrication of CMOS devices is well known to those skilled in the art, as generally described in the above cross-referenced application, and therefore will not be described in detail in this specification.

In FIGS. 11 and 12, the number of basic cell types has been kept relatively small at three types (BC1, BC2 and BC5) in order to achieve flexibility and compactness of design. Each basic cell is relatively small in respect to the area which it occupies on a semiconductor chip. By way of example in the present design, the largest basic cell is limited so as not to exceed an area of 9 grid spaces by 6 grid spaces or a total of 54 square grid spaces. This limitation facilitates precisely tailoring the power input for the basic cells. It should be appreciated however that if desired the basic cells can be made larger or smaller without departing from the design concept herein disclosed.

All of the basic cells are designed on a rectangular grid pattern which is defined by the horizontal grid markings or lines 42 and the vertical grid markings or lines 43 shown in FIGS. 11 and 12 lying on orthogonal X and Y axes, respectively. The dimensions between grid markings can be increased or decreased to change the size of the grid. The spacing between the horizontal (X axis) grid markings 42 and the vertical (Y axis) grid markings 43 can be the same or different as desired. In the present embodiment, the spacing between the vertical grid markings 43 is 10 microns and the spacing between the horizontal grid markings 42 is 8 microns.

The grid pattern has also been designed so that each intersection of the grid lines can be established by X axis and Y axis coordinates. The basic cells BC1, BC2 and BC5 do not exceed a predetermined maximum area of 9 horizontal grid spaces by 6 vertical grid spaces or a total 54 square grid spaces. However, it should be appreciated that the different basic cells need not have the same geometrical shapes or sizes.

The intersections of the grid lines 42 and 43 form grid points 46. The positions of these grid points 46 can be located by X axis and Y axis coordinates. Each basic cell will overlie certain grid points 46.

Each of the basic cells is provided with two spaced apart and parallel power connections 51 and 52 with the connection 51 being a power source bus ($V_{ss}$) and connection 52 being a power drain bus ($V_{DD}$). Each cell is also provided with one or more inputs and one or more outputs. The power connections 51 and 52 extend in a vertical direction (Y axis) and the input and the output leads extend in a horizontal direction (X axis) at right angles to the power buses or in a vertical direction displaced so as not to overlie the power buses.

With the arrangement shown, all of the crucial parts of the circuitry of the basic cells are laid out in such a manner that they overlie grid points 46. This overlying relationship is true in respect to the power buses and the other inputs and outputs for each cell. With the outputs located within the interior of the rectangular area defined by a basic cell, a flexibility is provided which facilitates interconnection of basic cells to form larger integrated circuits.

In general, there are four basic orientations for each basic cell. The first orientation is the normal cell orientation. The second is with the normal cell orientation flipped about only the X axis. A third is with the normal cell orientation flipped about only the Y axis. The fourth is with the normal cell orientation flipped about both the X axis and Y axis which is equivalent to rotating the entire cell by 180 degrees. An "X" postscripts (e.g., BC1-X) signifies an X axis flip. A "Y" postscript (e.g., BC1-Y) signifies a Y axis flip. An "XY" postscript (e.g., BC1-XY) signifies an X an Y axis flip.

Being able to flip the basic cells is advantageous because it makes it possible to share some regions between basic cells. When a region can be shared, the two combined regions will take less area than two separate regions.

In FIG. 11, the cellular integrated circuit layout for the 1-bit ALU cell of FIG. 7 is shown in detail. The pattern for the circuit of FIG. 11 is generally laid out along the X axis which extends from 0 through 22 units and a Y axis which extends from 0 through 31 units. The X and Y axis units were selected the same as in the above cross-referenced application. However, in the present application, the compactness of the design requires three fewer units in the Y axis.

In general, the basic cells of FIG. 7 are identified in one of two Y axis columns. The first Y axis column extends approximately over the 0 through 10 X axis units and the second Y axis column extends over the 11 through 22 X axis units. The basic cells in the left-hand column are identified along the left-hand margin of FIG. 11 and the basic cells in the right-hand column are identified along the right-hand margin of FIG. 11. More particularly, the basic cells along the left-hand column are as follows. The Inverter Basic Cell 7 is of the BC1 type with an XY orientation (BC1-XY). In the manner previously explained, the layout has been flipped both with respect to the X axis and the Y axis with respect to the orientation of a normally oriented basic cell (not shown). The basic cell 7 receives the power bus inputs 51 and 52 and the A input. The basic cell 7 produces the A output.

In FIG. 11, the AND-OR-INVERT basic cell 26 is located generally between the Y axis coordinates 20 through 24. The basic cell 26 receives the $S_2$ and $S_3$ inputs together with the B and $\overline{B}$ inputs. The basic cell 26 produces the "a" output.

In FIG. 11, the INVERT basic cell 12 is combined in an abutting relationship with the NAND basic cell 13. The basic cell 12 is generally located between the Y axis coordinates 18 and 19 while the basic cell 13 is generally located between the basic cell coordinates 15 and 18. It is apparent from FIG. 11 that the basic cells 12 and 13 are merged and share common field regions as indicated generally by the windows 32 and 33. The BC1-Y basic cell 12 is flipped with respect to the Y axis while the BC2-XY basic cell 13 is flipped both with respect to the X axis and Y axis. The output from the basic cell 13 is the $\overline{G}$ value.

In FIG. 11, the NAND basic cell 11 is located generally between the Y axis coordinates 13 through 15. The basic cell 11 shares common regions with the NAND basic cell 29 which is located generally between the Y axis coordinates 10 through 13. The basic cell 11 is of the BC2-Y type while the basic cell 29 is of the BC2-XY type.

In FIG. 11, the AND-OR-INVERT basic cell 28 is located generally between the Y axis coordinates 5 through 10 and is of the BC5-XY type. The output from the basic cell 28 is the F output of the 1-bit ALU of FIG. 11.

In FIG. 11, the right-hand column of basic cells includes the INVERT basic cell 25 (BC1-X) located between Y axis coordinates 28 through 30. The AND-OR-INVERT basic cell 27 (BC5-X) located between Y axis coordinates 20 through 24; the NAND basic cell 9 (BC2-X) located between Y axis coordinates 16 through 19; the NAND basic cell 17 located between Y axis coordinates 15 through 17; the INVERT basic cell 18 (BC1-X) located between Y axis coordinates 13 through 15; the AND-OR-INVERT basic cell 19 (BC5-X) located between Y axis coordinates 8 through 12; and the INVERT basic cell 16 (BC1-X) located between Y axis coordinates 5 through 7.

In FIG. 12, the cellular integrated circuit layout for the even 1-bit ALU unit of FIG. 8 is shown. The FIG. 12 layout is substantially identical to the FIG. 11 layout.

In FIG. 12, the basic cells corresponding to the basic cells of FIG. 11 are identified with the same basic cell number, but with a prime added. This marking in FIGS. 11 and 12 maintains the same relationship between the unprimed and primed basic cell numbers as is employed in FIGS. 7 and 8. In FIG. 12, the INVERT basic cell 16' is not employed and hence has no input or output connections to the other basic cells. Further, the $\overline{G}$ output from basic cell 13' is connected, via the input lead (horizontal shaded area) of basic cell 11' as an input to the basic cell 19'. At the same time, the P output from the basic cell 9' is inverted in the basic cell 18' to form the P input to the basic cell 19'. By way of distinction, the analogous connections in FIG. 11 have the G input to the basic cell 18 inverted to form the G signal to provide an input to the basic cell 19. At the same time, the P output from the basic cell 9 connects directly as an input to the basic cell 19. Also in FIG. 11, the basic cell 16 is employed to invert the $C_{in}$ signal.

In accordance with the above detailed description of the present invention, improved arithmetic and logic units formed by one or more 1-bit arithmetic and logic unit cells have been described. Each 1-bit ALU cell is formed by pluralities of cellular integrated basic cells. For purposes of the specification including the following claims, the term "cellular integrated basic cell" is intended to have the following definition. Each cellular integrated basic cell includes a semiconductor body organized in accordance with a grid pattern defining grid points over an area of the body. A plurality of active elements are formed in the body within the area defined by the grid points. Connection means (such as via holes and conductors or leads) are provided for connecting power inputs to the basic cell at selected first ones of the grid points. Connection means are also provided for connecting one or more data inputs (e.g., A and B) or internal data signals to the basic cell at one or more selected second ones of the grid points. Additionally, connection means are provided for connecting a data output from the basic cell at a selected third one of the grid points.

For purposes of the specification including the following claims, the expression "one logic level delay" is intended to mean the delay time of a simple gate such as an AND gate, NAND gate, OR gate or NOR gate.

While the invention has been particularly shown and described with reference to the preferred embodiments thereof, it will be understood by those skilled in the art that those changes in form and details may be made therein without departing from the spirit and the scope of the invention.

What is claimed is:

1. An arithmetic and logic unit including a plurality of 1-bit arithmetic and logic unit (ALU) cells wherein each 1-bit ALU cell comprises,
   a plurality of cellular integrated basic cells connected to receive inputs including a first data input and a second data input for logically combining the first and second data inputs to form a data output as a function of said first and second data inputs and wherein each 1-bit ALU cell includes a portion of a semiconductor body including a plurality of semiconductor active elements arrayed in said body in accordance with a grid pattern, where said first data input, said second data input and said data output for each 1-bit ALU cell connect to said active elements at selected ones of said grid points.

2. The unit of claim 1 wherein said plurality of cellular integrated basic cells consists of no greater than three types of basic cells.

3. The unit of claim 1 wherein each 1-bit ALU cell includes a carry circuit portion formed by one or more of said cellular integrated basic cells.

4. The unit of claim 3 wherein said carry circuit portion for each ALU cell includes a basic cell having one unit of delay and having a carry-in and a carry-out and wherein said carry circuit portions are connected in series with the carry-out of one portion connected to the carry-in of a succeeding portion to form a carry ripple circuit for said arithmetic and logic unit whereby the series delay of carry signals through the carry-outs and carry-ins is said one unit of delay for each said carry circuit portion.

5. The logic unit of claim 1 wherein said basic cells include means for generating a bit propagate signal, include means for generating a bit generate signal wherein said bit generate signal is of the opposite polarity of said bit propagate signal, and include logical combining means for logically combining said bit propagate and said bit generate signals to form said data output.

6. The unit of claim 5 wherein said logical combining means includes an EXCLUSIVE-NOR circuit including an AND-OR-INVERT basic cell.

7. The unit of claim 6 including a carry circuit formed of an INVERT basic cell for inverting one of said bit propagate or said bit generate signals and including an AND-OR-INVERT basic cell for receiving a carry-in signal for combining the bit propagate, bit generate and carry-in signals as inverted to form a carry-out signal.

8. An arithmetic and logic unit including a plurality of 1-bit arithmetic and logic unit (ALU) cells wherein each 1-bit ALU cell comprises,
   a plurality of cellular integrated basic cells, including AND-OR-INVERT basic cells, connected to receive inputs including a first data input and a second data input for logically combining the first and second data inputs to form a data output as a function of said first and second data inputs.

9. An arithmetic and logic unit including a plurality of 1-bit arithmetic and logic unit (ALU) cells wherein each 1-bit ALU cell comprises,
   a plurality of cellular integrated basic cells, consisting of INVERT, NAND, and AND-OR-INVERT basic cells, connected to receive inputs including a first data input and a second data input for logically combining the first and second data inputs to form a data output as a function of said first and second data inputs.

10. An arithmetic and logic unit comprising a plurality of 1-bit arithmetic and logic unit (ALU) cells where each ALU cell includes first and second data input and a data output and includes a carry-in and a carry-out and where each ALU cell includes a plurality of basic cells including means for forming a bit propagate signal, including means for forming a bit generate signal where said bit generate signal is of the opposite polarity of said bit propagate signal, including first means for logically combining said bit propagate and said bit generate signals to provide said data output, and including a carry circuit portion having an inverter for inverting one of said bit propagate or said bit generate signals and having second means for logically combining the carry propagate and carry generate signals as inverted and said carry-in to form said carry-out,
   said unit having means for connecting the carry-out of one carry circuit portion as the carry-in of the following carry circuit portion to form a carry ripple circuit for said unit.

11. The unit of claim 10 wherein said carry circuit portions are of two types including an odd type having an inverter for inverting said bit generate signal and of an even type for inverting said bit propagate signal and wherein said means for connecting alternately connects the carry-out of an even carry circuit portion as the carry-in to an odd type carry circuit portion and connects the carry-out of an odd type carry circuit portion as the carry-in to an even type carry circuit portion whereby the carry ripple circuit is formed by the series connection of alternate odd and even carry circuit portions.

12. The unit of claim 11 wherein said carry circuit portion for each ALU cell includes a basic cell having one unit of delay whereby the series delay of carry signals through the carry-outs and carry-ins is said one unit of delay for each said carry circuit portion.

13. The unit of claim 11 wherein said first means for logically combining includes an AND-OR-INVERT basic cell.

14. The unit of claim 11 wherein said second means for logically combining includes an AND-OR-INVERT basic cell.

15. An arithmetic and logic unit comprising a plurality of 1-bit arithmetic and logic unit (ALU) cells where each ALU cell includes a first data input A, a second data input B, and a data output F and includes a carry-in and carry-out and where each ALU cell includes a plurality of basic cells consisting of not more than three types of basic cells and wherein each ALU cell includes means including one or more basic cells for forming bit propagate signal P where P is the logical OR of A and B, means including one or more basic cells for forming a bit generate signal $\overline{G}$ where $\overline{G}$ is of the opposite polarity of P and where $\overline{G}$ is the logical NAND of A and B, means including one or more basic cells for logically combining P and $\overline{G}$ together with the carry-in to form said data output F, a carry circuit portion including one or more basic cells having an inverter for inverting P or $\overline{G}$, means including one or more basic cells for logically combining the carry propogate and generate signals and said carry-in to form said carry-out signal, said unit having means for connecting the carry-out of one carry circuit portion as a carry-in of the following carry circuit portion to form a carry ripple circuit for said unit.

16. The unit of claim 15 having odd type carry circuit portions wherein said inverter inverts said carry generate signal $\overline{G}$ to form G and wherein said second means for logically combining combines a carry-in $C_{in}$ together with P and G to form a carry-out $\overline{C}_{out}$ and having even type carry circuit portions wherein said inverter inverts the carry propagate P to $\overline{P}$ and wherein said second means for logically combining logically combines a carry-in $\overline{C}_{in}$ together with $\overline{P}$ and $\overline{G}$ to form a carry-out $C_{out}$.

* * * * *